United States Patent
Rafiq

(10) Patent No.: US 7,256,633 B1
(45) Date of Patent: Aug. 14, 2007

(54) SYSTEMS FOR IMPLEMENTING HIGH SPEED AND HIGH INTEGRATION CHIPS

(75) Inventor: Sumbal Rafiq, Folsom, CA (US)

(73) Assignee: Ample Communications, Inc., Fremont, CA (US)

( * ) Notice: Subject to any disclaimer, the term of this patent is extended or adjusted under 35 U.S.C. 154(b) by 39 days.

(21) Appl. No.: 11/299,212

(22) Filed: Dec. 8, 2005

Related U.S. Application Data

(62) Division of application No. 10/838,894, filed on May 3, 2004.

(60) Provisional application No. 60/467,404, filed on May 1, 2003.

(51) Int. Cl.
*H03K 3/356* (2006.01)

(52) U.S. Cl. ............ 327/202; 327/203; 327/208; 327/218

(58) Field of Classification Search .......... None
See application file for complete search history.

(56) References Cited

U.S. PATENT DOCUMENTS

| | | | |
|---|---|---|---|
| 3,104,330 A | 9/1963 | Hamilton | |
| 4,943,787 A | 7/1990 | Swapp | |
| 5,130,568 A * | 7/1992 | Miller et al. | 327/202 |
| 5,184,027 A | 2/1993 | Masuda et al. | |
| 5,272,390 A | 12/1993 | Watson et al. | |
| 5,570,045 A | 10/1996 | Erdal et al. | |
| 5,751,665 A | 5/1998 | Tanoi | |
| 5,789,957 A * | 8/1998 | Fucili et al. | 327/203 |
| 6,081,145 A | 6/2000 | Bandai et al. | |
| 6,271,697 B1 | 8/2001 | Hayashi et al. | |
| 6,380,780 B1 * | 4/2002 | Aitken et al. | 327/202 |
| 2001/0020856 A1 | 9/2001 | Yamakita et al. | |
| 2002/0060594 A1 | 5/2002 | Stasiak et al. | |
| 2003/0231043 A1 | 12/2003 | Ibuka | |

* cited by examiner

*Primary Examiner*—Tuan Lam
(74) *Attorney, Agent, or Firm*—Pillsbury Winthrop Shaw Pittman LLP

(57) ABSTRACT

Disclosed are methods and systems for implementing various circuitry within a high speed, high frequency signal environment such as an integrated circuit. In one embodiment, an improved clock tree mechanism utilizes multiple low power drivers to distribute a clock signal to various load cells. In another embodiment, a single circuitry in current mode logic is used to implement a combined multiplexer, buffer and level shifter. In other embodiments, improved static and partially static flip-flop circuitry is disclosed which uses fewer devices and less power than conventional circuitry while achieving the same functionality.

22 Claims, 9 Drawing Sheets

SYSTEMS FOR IMPLEMENTING HIGH SPEED AND HIGH INTEGRATION CHIPS

CROSS-REFERENCE TO RELATED APPLICATIONS

This application is a divisional of U.S. application Ser. No. 10/838,894 filed May 3, 2004 which claims priority to U.S. provisional application Ser. No. 60/467,404 filed May 1, 2003, the contents of which are incorporated herein by reference.

FIELD OF THE INVENTION

The present invention relates to integrated circuits. More particularly, the present invention is directed to components used in integrated circuits that operate at a high speed and are highly integrated.

BACKGROUND

In several of today's large-scale Integrated Circuits (ICs), a single clock signal is required at numerous nodes that are physically separated over large distances. The parameters used in measuring the clock signal quality when a clock signal is transmitted over large distances are:
 a. Maximum frequency of operation;
 b. Duty cycle variation;
 c. Noise injection into the substrate;
 d. Sensitivity to substrate and VDD/GND noise;
 e. Matching (skew, etc) between the clock signals at several "leaf" nodes of the clock signals; and
 f. Jitter In addition, the "clock tree" may also be required to multiply a high-quality, low frequency signal to generate a very high frequency clock signal. The Clock tree can be defined as a circuit that distributes a single clock source to multiple destinations or "loads". In addition the clock tree may also multiply or divide the frequency of the reference clock source. FIG. 1 shows a typical clock tree. A Phase-Locked Loop (PLL), which is well-known in the art, is employed in such applications as part of the clock tree.

The conventional method of building a clock tree is to derive a high-quality clock signal from an external crystal and use it as a reference signal for the PLL, as shown in FIG. 1. This reference signal is multiplied by the PLL 110, resulting in a higher frequency CMOS signal (buffered, as required, by buffer 120). The clock tree (shown as a sequence of N loads 130, 131, 132 ... 13N, the PLL 110 and BUF 120) is employed to transport this signal over large distances using at least N CMOS buffers 140, 141, 142 ... 14N, respectively.

This technique is quite adequate if the clock is distributed over relatively smaller areas and the frequency of the clock signal is relatively low (less than, say 1 GHz). The limiting factors and problems associated with this technique, when applied to very high frequencies (greater than about 1 GHz) and/or over large distances, are as follows:
 Effect of routing inductance/T-line effect;
 Timing jitter due to VDD/GND and substrate;
 Noise coupling to/from other routed nets;
 Noise injection due to high-frequency and high-power drivers;
 Sensitivity to VDD/GND/Substrate noise;
 Duty-cycle degradation; and
 Power consumption Referring to the scheme 100 of FIG. 1, it can be observed that a single node is driving the clock signal to all of the loading cells (131, 132, ... 13N). As a result, this single driver must be capable of driving a very large load at a very high frequency. This is problematic because such a driver would introduce significant noise into the power supply and into the silicon substrate, which will corrupt the signals of any adjacent circuits.

Another issue in integration of high speed circuitry is illustrated by the circuit 200 of FIG. 2. This circuit 200 combines three different functions into one functional block, listed as follows:
 a) Two-to-One multiplexer 210;
 b) Level-shifter 220; and
 c) Buffer 230.

Circuit 200 is a typical implementation of all these functions. One of the two CMOS-level data signals (D1 and D2) is output by the MUX 210 depending on the selector control signal SEL. The level shifter 220 converts the CMOS signal to a low-voltage analog signal. Finally, the BUF cell (analog buffer) 230 generates a low voltage differential signal, OUTP and OUTN, capable of driving a large load. A circuit such as circuit 200 requires many CMOS transistors and could introduce more noise into the power supply and silicon substrate. This noise can propagate to other circuits in the vicinity of this circuit.

FIG. 3 shows a generic flip-flop very commonly used in the industry. This flip-flop 300 uses transmission gates, two for each stage of the flip-flop. The total number of clocked transistors in this scheme is eight and are relatively bigger in size. The two clock inverters 393 and 394 driving these eight transistors need to be big enough to be able to drive these transistors with an acceptable and relatively short rise and fall time.

Circuit 300 shows Data (D) and Scan Data (SD) inputs coupled to inverters 301 and 302, respectively. Components 301, 302, 310 and 315 make a Multiplexer circuit (MUX). Depending on the logical value of input SE (Logic 1 or 0), either input D with inverter 301 and transmission gate 310 is selected; or input SD with inverter 302 and transmission gate 315 is selected. Inverters 301 and 302 feed the transmission gates 310 and 315 respectively, which are triggered by clocks CKB and CK (coming from the reference clock signal CLK, i.e. outputs of inverters 393 and 394 respectively. CKB is an inverted clock version of reference clock CLK, and CK is the same as CLK with a steeper rise time and with a delay equal to delay through the two clock inverters 393 and 394). Each transmission gate 310 and 315 is constructed with a pair of CMOS transistors coupled source to source and drain to drain. Transmission gates 310 and 315 are in ON state i.e., the current can go through them, when the reference clock CLK is low (or at logic level 0), and are in OFF state when CLK is high (or at logic level 1). The output of the these transmission gates is sent to the first of two latches.

The first latch consists of inverter 320, inverter 340, and a transmission gate 325. Inverters 320 and 340 are in back-to-back configuration through the transmission gate 325. When the clock CLK is low (or at logic level 0), transmission gate 325 is in OFF state and the latch is in "load" mode. When the clock is high (or at logic level 1), transmission gate 325 is in ON state and the latch "stores" data.

Latch one feeds inverter 330 which acts as a driver for latch two through the transmission gate 350. Transmission gate 350 is in ON state when clock CLK is high.

The output of the transmission gate 350 feeds into latch two and the final inverter driver 360 for output Q. Latch two consists of inverters 370 and 390, and a transmission gate 380. This transmission gate 380 is in ON state when Clock CLK is low (or at logic level 0). Hence the latch is in store mode when clock CLK is low (logic level 0), and in the load mode when clock CLK is high (logic level 1).

The overall operation of the flop 300 is as follows: Data from input D or SD is selected depending on value of SE. If SE is logic level 1, input from SD is selected; and if SE is logic level 0, input D is selected. When the clock CLK is low (logic level 0), transmission gates, 310, 315, and 380 are ON; and transmission gates 325 and 350 are OFF. When clock CLK is low (logic 0), data is loaded into the flop through inverters 301, 320, and 330. When clock CLK goes high (logic level 1), transmission gates, 310, 315, and 380 are OFF, and transmission gates 325 and 350 are ON. Data is stored in latch one and is also captured at the output through inverter 360.

Such circuits utilize many individual component devices and when used in high frequency and high speed signal applications, are noisy and consume much power and thus, are not suitable for such applications.

SUMMARY

The invention consists in various embodiments of methods and systems for implementing various circuitry within a high speed, high frequency signal environment such as an integrated circuit. In one embodiment of the invention, an improved clock tree mechanism utilizes multiple low power drivers to distribute a clock signal to various load cells. In another embodiment of the invention, a single circuitry in current mode logic is used to implement a combined multiplexer, buffer and level shifter. In other embodiments of the invention, improved static and partially static flip-flop circuitry is disclosed which uses fewer devices and less power than conventional circuitry while achieving the same functionality.

DETAILED DESCRIPTION

Figure 1:
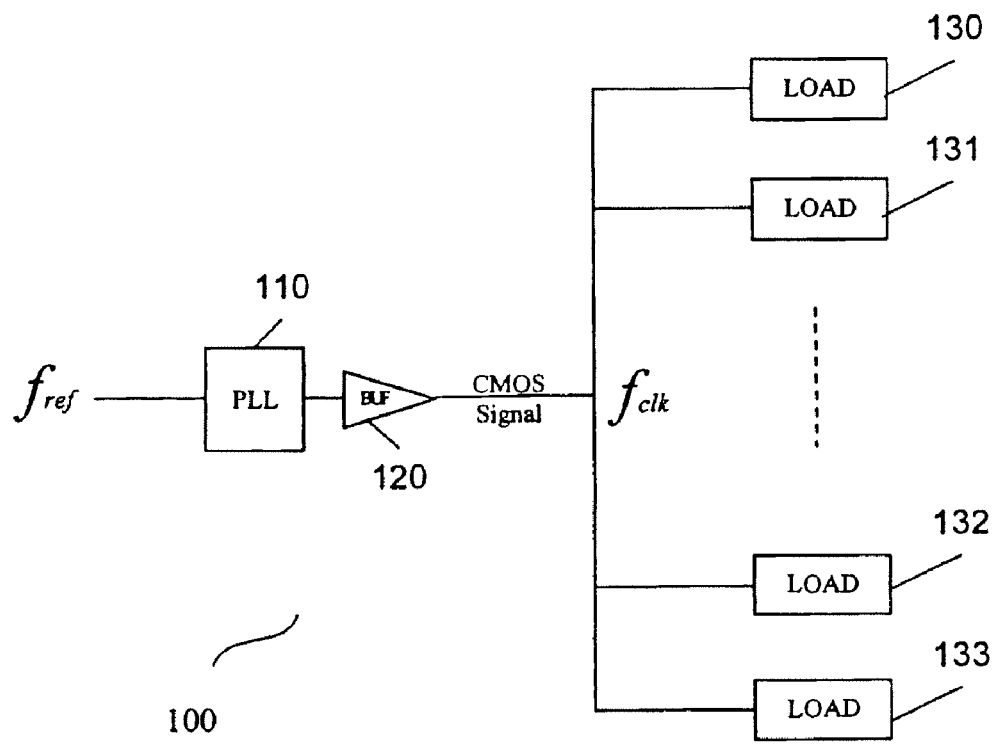
FIG. 1 illustrates a typical clock tree.
Figure 4:
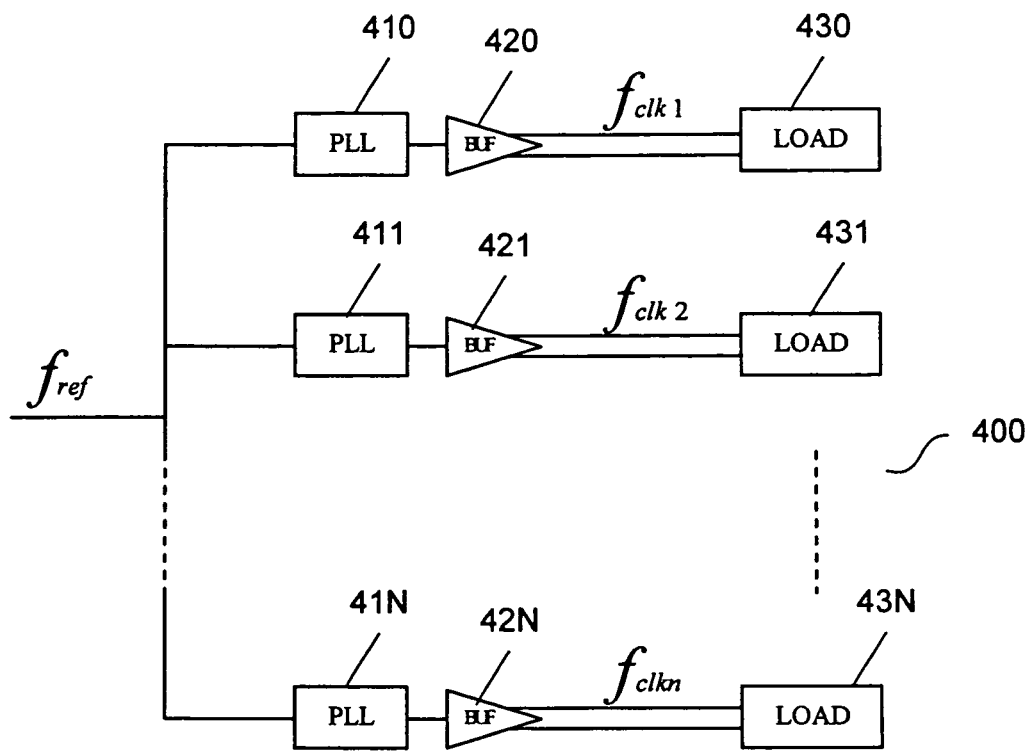
FIG. 4 illustrates a novel clock tree according to at least one embodiment of the invention.

In one embodiment of the invention, a new type of clock tree which is shown in FIG. 4 is set forth which can overcome the limitations of conventional clock trees such as that shown in FIG. 1. In this design, the high-speed clock signals are distributed to all the loading nodes using multiple differential drivers. These drivers distribute the high-frequency clock signal to the loading nodes over a much shorter routing distance, eliminating the complexity associated with a single high-power and high-frequency driver. Though the clock signals are electrically separate signals/nodes, the use of multiple PLLs with identical reference clock input signals guarantees that all the clock signals are in phase synchronization.

As shown, a plurality of N PLLs (Phase Locked Loops) 410, 411 . . . 41N each multiplies the reference signal of frequency $f_{ref}$ resulting in a series of higher frequency clock signals with frequencies $f_{clk1}$, $f_{clk2}$, . . . $f_{clkN}$, respectively. Each multiplied signal is buffered by a respective buffering cell 420, 421, . . . 42N. The differential signal output by the buffering cells is then distributed over the circuit to clock loads 430, 431, . . . 43N, respectively. Further, as stated above, if the PLLs 410, 411, . . . 41N are identical, receive identical reference clock inputs and have identical loads at their outputs, then the resulting signals will have identical frequencies and be in phase synchronization.

Some characteristics and features of improved clock tree 400 (when compared to conventional clock trees) are:

i) The design is more efficient since each of the high-frequency drivers (i.e. PLLs 410, 411, etc.) need to drive only a fraction of the total load, and thus, each of these drivers need not require a high power design. This will reduce the potential for noise injection into the substrate;

ii) The high-frequency signal is distributed using much shorter signal routes by each differential driver. This will:

a. Reduce/eliminate the effects of routing inductance/T-line effects;

b. Reduce noise coupling to/from other routed nets;

c. Reduce duty-cycle degradation; and d. Reduce average noise injection into the substrate.

iii) The use of identical PLLs in multiple locations will:

a. Reduce or limit the amount of timing jitter due to VDD/GND/substrate noise and coupling noise; and b. Restore the duty cycle to 50%, which is highly desired.

Figure 2:
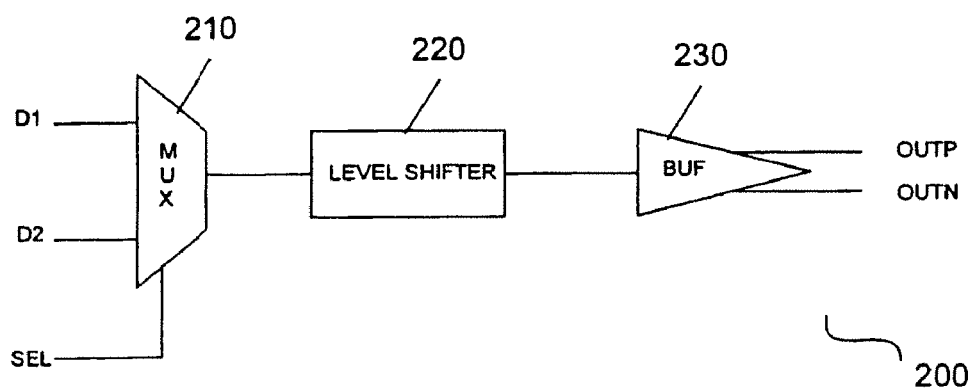
FIG. 2 illustrates a conventional combinational circuitry having a buffer, level shifter and multiplexer.
Figure 5:
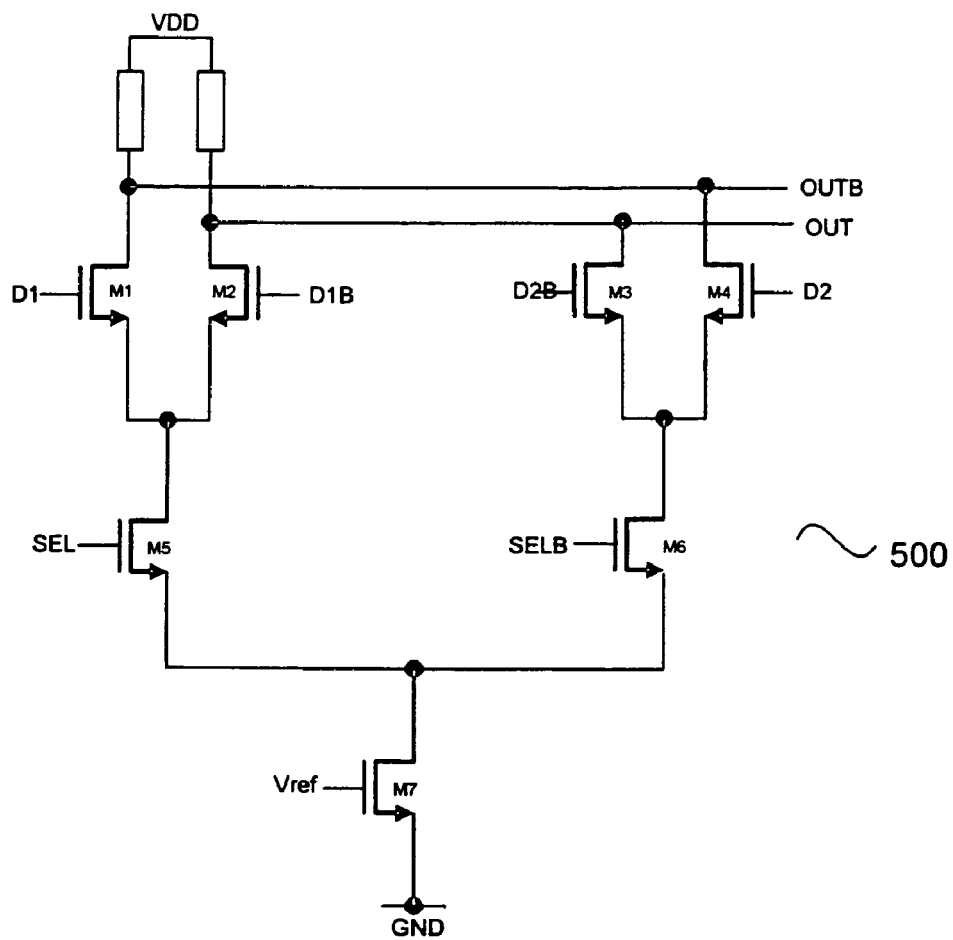
FIG. 5 illustrates a novel combinational circuitry for use in high speed applications according to at least one embodiment of the invention.

To overcome the problem described with regard to the combinational circuit 200 of FIG. 2, yet another embodiment of the invention is illustrated in Figure. Circuit 500 of FIG. 5 employs a current-mode-logic (CML) type of buffer in order to achieve all of the functions in a single circuit block. The signals D1, D2, D1B, D2B, SEL and SELB are CMOS-level signals. One of the two CMOS-level data signals (D1 and D2) is output by the MUX 210 depending on the selector control signal SEL. The level shifter 220 converts the CMOS signal to a low-voltage analog signal. Finally, the BUF cell (analog buffer) 230 generates a low voltage differential signal, OUTP and OUTN, capable of driving a large load. OUT and OUTB are low voltage analog output signals. The transistor M7 is configured to operate as a current-source with the application of a signal $V_{ref}$. The transistors M1, M2, M3 and M4 are configured as current switches controlled by the two data signals, D1 and D2. The transistors M5 and M6 are configured as current switches controlled by the signals SEL and SELB.

When SEL=1 (high) and SELB=0 (low), the transistors M3 and M4 are switched off and the signals at the nodes OUT and OUTB are logically identical to the data input D1 and D1B. By careful selection of the various node voltages, currents through the transistors and resistor values, the CMOS data signals D1/D1B are converted into a low-voltage analog output capable of driving relatively large loads at OUT/OUTB.

Likewise, when SEL=0 and SEB=1, the transistors M1 and M2 are switched off, and the signals at the OUT and OUTB are logically identical to D2 and D2B, respectively. Thus, the data signal pair D2/D2B is selected and level-shifted by circuit 500. The advantage of using this design is that CMOS signals are selected and converted into a low-voltage differential signal suitable for transmission over a long route on the chip using a straightforward circuit. Circuit 500 is less noisy and requires fewer devices than conventional circuits such as that shown in FIG. 2.

Figure 3:
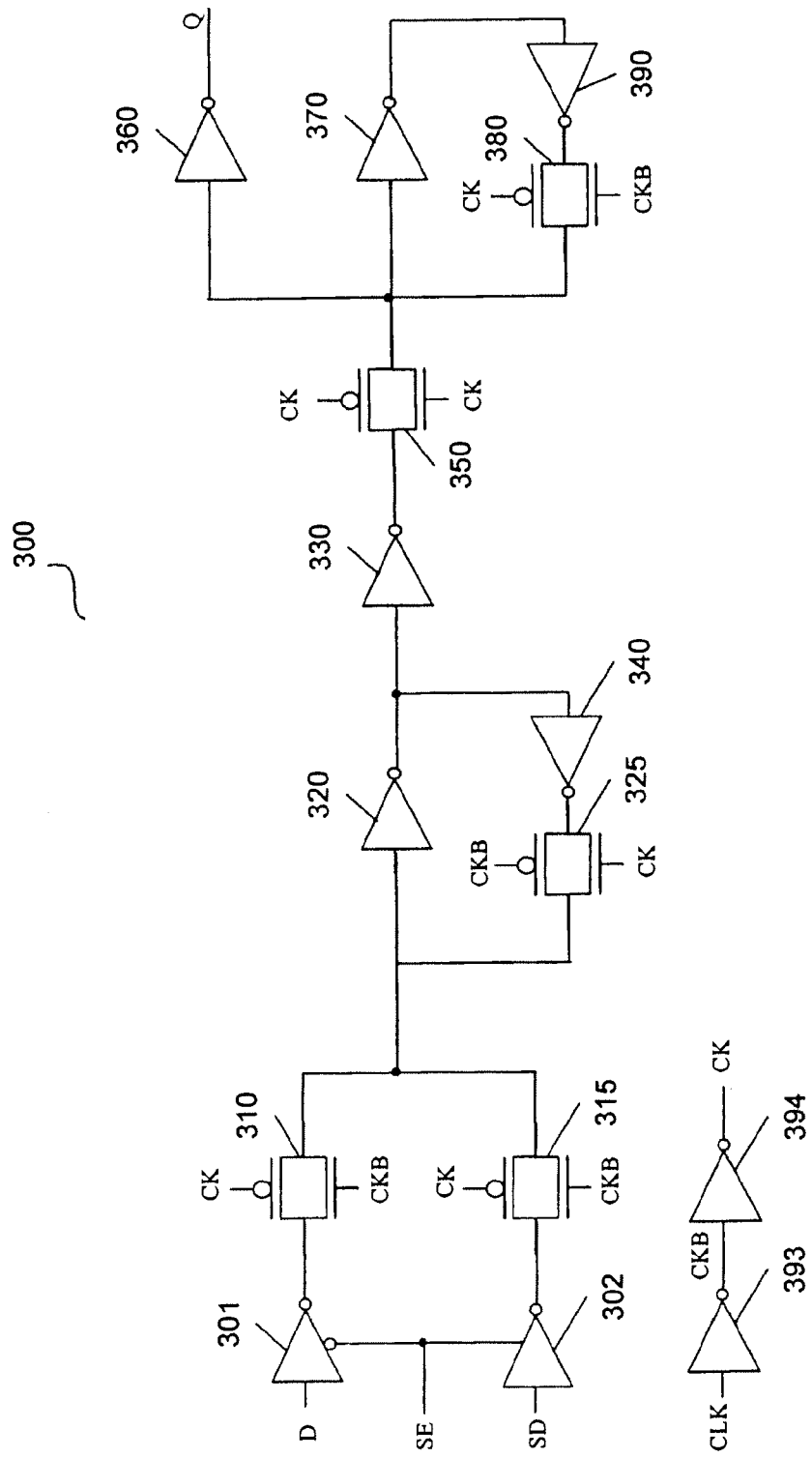
FIG. 3 shows a generic flip-flop very commonly used in the industry.
Figure 6:
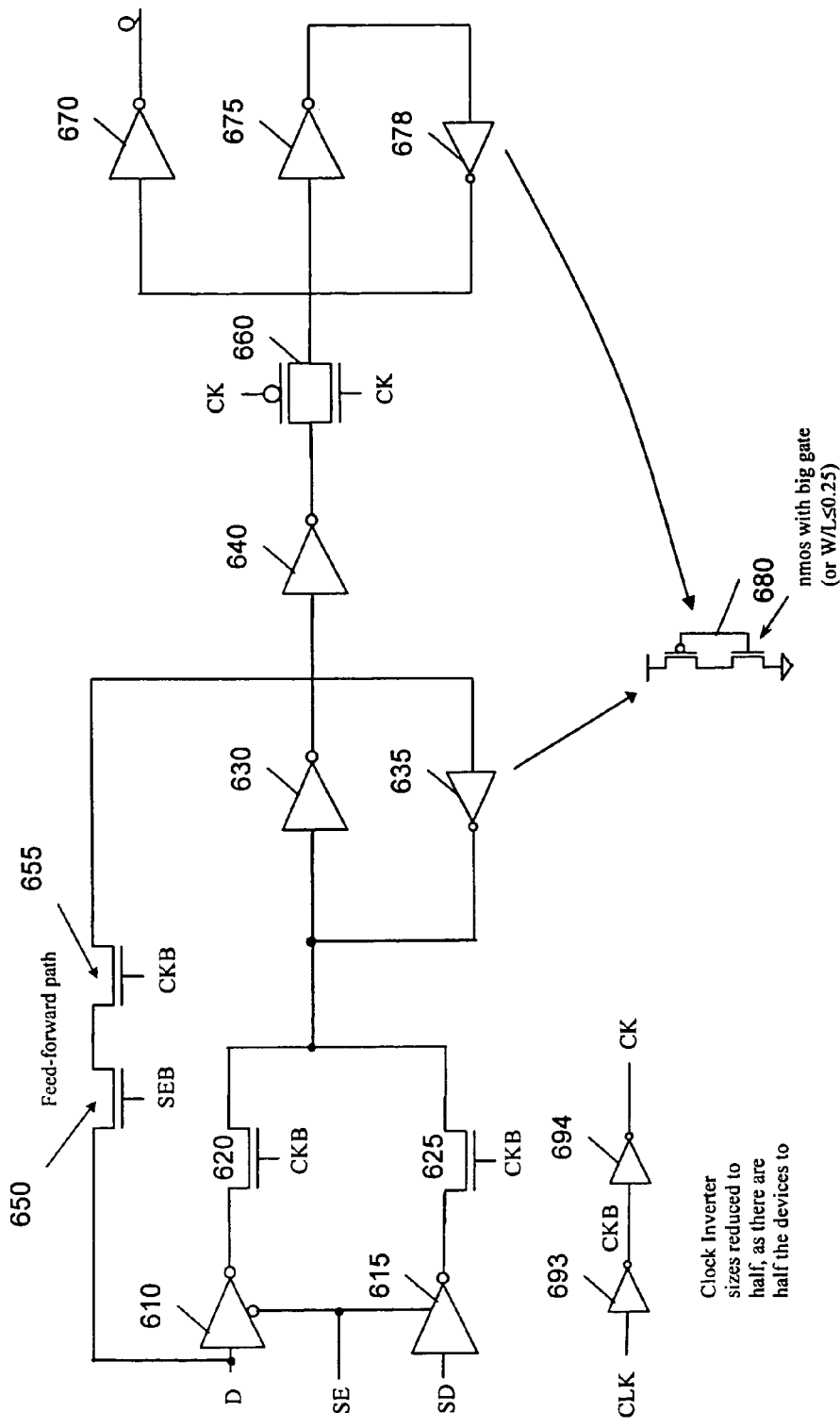
FIG. 6 illustrates an enhanced flip-flop according to at least one embodiment of the invention.

FIG. 6 illustrates one embodiment of an enhanced flip-flop according to the invention. First, when compared to circuit 300 of FIG. 3, a single NMOS transistor has replaced the transmission gate in the data and scan data paths. Second, both the transmission gates in the two latches have been removed.

One result of replacing the transmission gate by a single NMOS transistor is an increased setup time. To overcome this problem, a feed-forward path is provided from data input (D) to the output of the first latch. This not only makes up for the increased setup time but also decreases the setup time further to an even lower value compared to the traditional scheme.

The second feature mentioned, i.e., by the removal of the two transmission gates from the feedback paths of the two latches, leads to two problems, namely: (a) the two inverters driving these latches need an increased size to be able to overcome the increased strength needed to drive these latches; and (b) the time for these latches to latch or come to a stable state increases. These problems are overcome by carefully sizing the latch transistors in the following manner: In each of the two latches, the gate size of the NMOS transistor is increased only in the feedback path. The size is determined after multiple simulations with different gate sizes. Then, after taking into account the factors of speed versus power consumption, a tradeoff is made to obtain an optimal gate size. For example, the width/length (W/L) ratio for this NMOS transistor should be $\leq 0.25 \pm 0.09$ depending on the technology/process used (i.e. 0.25 um, 0.18 um or 0.13 um).

The flip-flop design 600 requires extensive simulation for the determination of the most suitable sizes of each transistor that would result in the lowest power, maintaining or outperforming the setup, hold and clock-to-Q timing requirements. As the number of clocked transistors in this scheme has been reduced to exactly half (when compared to circuit 300 of FIG. 3), the strength of clock inverters driving these flops can also be reduced to almost half. Likewise, the clock power could also be reduced in half. The sizes of the transistors in the rest of the flip-flop circuitry are also reduced, resulting in an overall flip-flop area reduction.

Circuit 600 is clocked through the use of two clock inverters 693 and 694. These clock inverters 693 and 694 are reduced in size by half when compared with clock inverters 393 and 394 in the conventional flip-flop circuit 300 since there are now half as many devices to drive. Circuit 600 shows Data (D) and Scan Data (SD) inputs coupled to inverters 610 and 615, respectively. Components 610, 615, 620 and 625 operate together to form a multiplexer/selection mechanism. Depending on the logical value of input SE (Logic 1 or 0), either input D going to inverter 610 and transistor 620 is selected; or input SD going to inverter 615 and transistor 625 is selected. Inverters 610 and 615 feed the transistors 620 and 625 respectively, which are triggered by clock signal CKB (the output of clock signal being sent through inverter 693). CKB is an inverted clock version of reference clock CLK, and CK is the same as CLK with a steeper rise time and with a delay equal to delay through the two clock inverters 693 and 694.

The D input is also sent through a feed-forward path characterized by transistors 650 and 655 triggered by a SEB signal and the clock signal CKB, respectively. The feed forward path is coupled to the output of a first latch.

The first latch consists of an inverter 630 and an inverter 635. Inverter 635 which is in the feedback path of the latch has an increased gate size. This gate size is shown as a width/length ratio of $\leq 0.25$ in sample inverter 680 which is in an NMOS configuration, as discussed below.

The first latch feeds inverter 640 which acts as a driver for a second latch accepting that signal via transmission gate 660. Transmission gate 660 is in ON state when clock CLK is high.

The output of the transmission gate 660 feeds into a second latch and the final inverter driver 670 for output Q. The second latch consists of an inverter 675 and an inverter 678. The second latch arrangement is similar to the first latch arrangement such that inverter 678 which is in the feedback path of the latch has an increased gate size. This gate size is shown as a width/length ratio of $\leq 0.25$ in sample inverter 680 which is in an NMOS configuration.

The overall operation of the flop 600 is as follows: Data from input D or SD is selected depending on value of SE. If SE is logic level 1, input from SD is selected; and if SE is logic level 0, input D is selected. The Data signal D is fed forward when the SEB signal and CKB signal are both high. The SEB signal is high when the SE is low (0). This occurs through transistors 650 and 655 to provide a regenerative feed forward of the Data signal when the Data signal is selected and propagates through the flop circuit 600.

The circuit 600 as configured above is well suited for applications where the fan-out ranges from 1 to 5. For flip-flops with a larger fan-out (>5), a modification of the scheme is used, where the feed-forward path from data input is fed-forward to the input of the first latch with an additional small inverter at the beginning of the feed-forward path to avoid any loading. This scheme is shown in FIG. 7.

Figure 7:
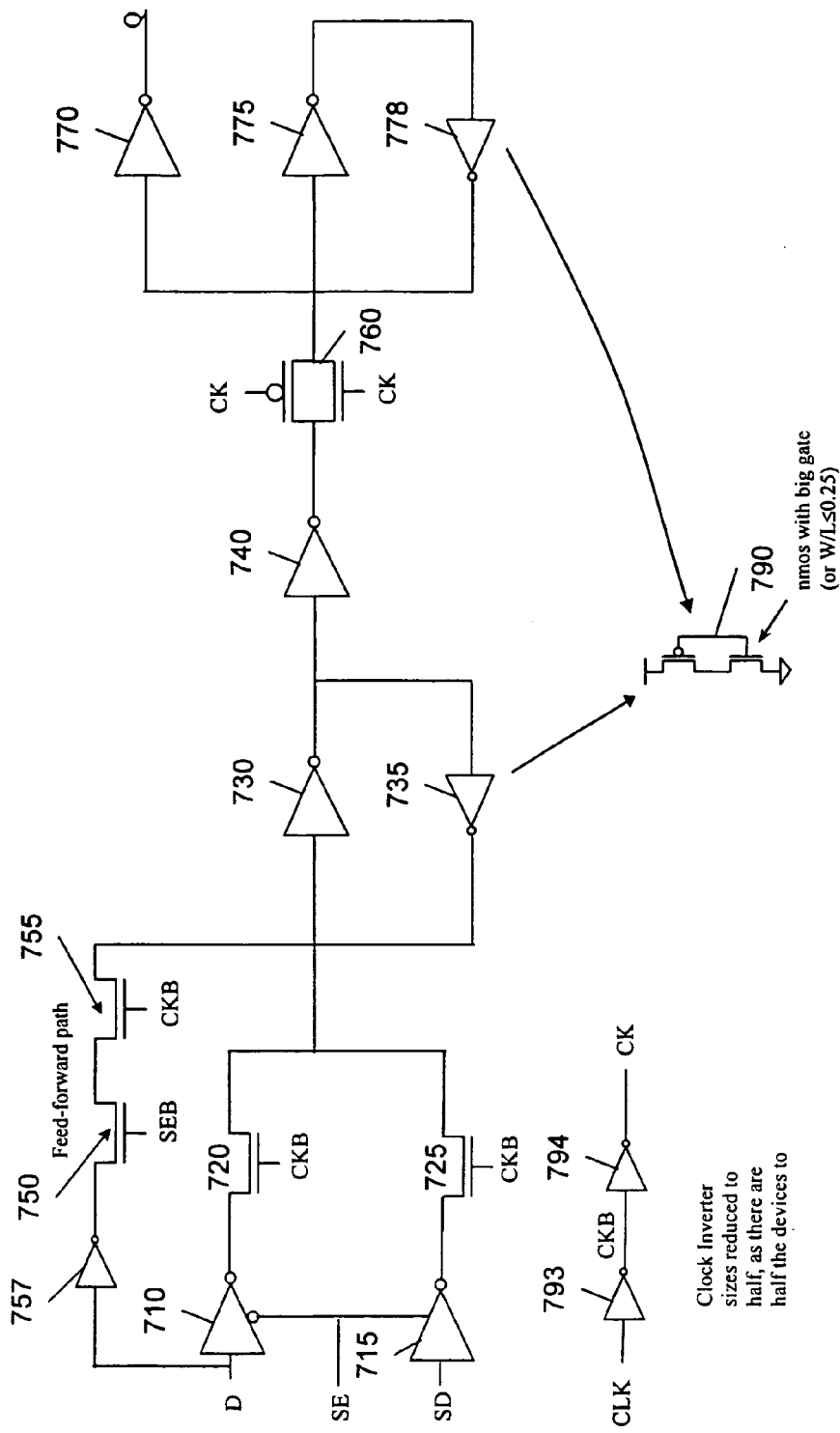
FIG. 7 illustrates an enhanced flip-flop for larger fan-out applications according to at least one embodiment of the invention.

Elements 793, 794, 790, 710, 715, 720, 725, 730, 735, 740, 750, 755, 760, 770, 775, and 778 of FIG. 7 correspond to elements 693, 694, 690, 610, 615, 620, 625, 630, 635, 640, 650, 655, 660, 670, 675, and 678 of FIG. 6, respectively, and operate in a like manner thereto. Thus, these elements of FIG. 7 can be described in a like manner as discussed above with respect to FIG. 6. FIG. 7, however, includes a small inverter 757 which is coupled to the first of the transistors 750 in the feed forward path.

The scheme has been implemented in 0.25 um, 0.18 um, and 0.13 um technologies. It can be shown or demonstrated that the following improvements in power, performance and area are available with circuits 600 and 700:

1. A power consumption improvement (i.e., power reduction) of 45% to 55% in clock related circuitry;

2. Total power consumption reduction in the flip-flop of 5 to 18%;

3. An area improvement of 8% to 19% overall area reduction in the flip-flop; and 4. A performance/timing improvement such that all the flip-flops resulted in an equivalent or improved setup, hold, rise, fall and clock-to-Q times compared to the flip-flops using a conventional scheme.

Figure 8:
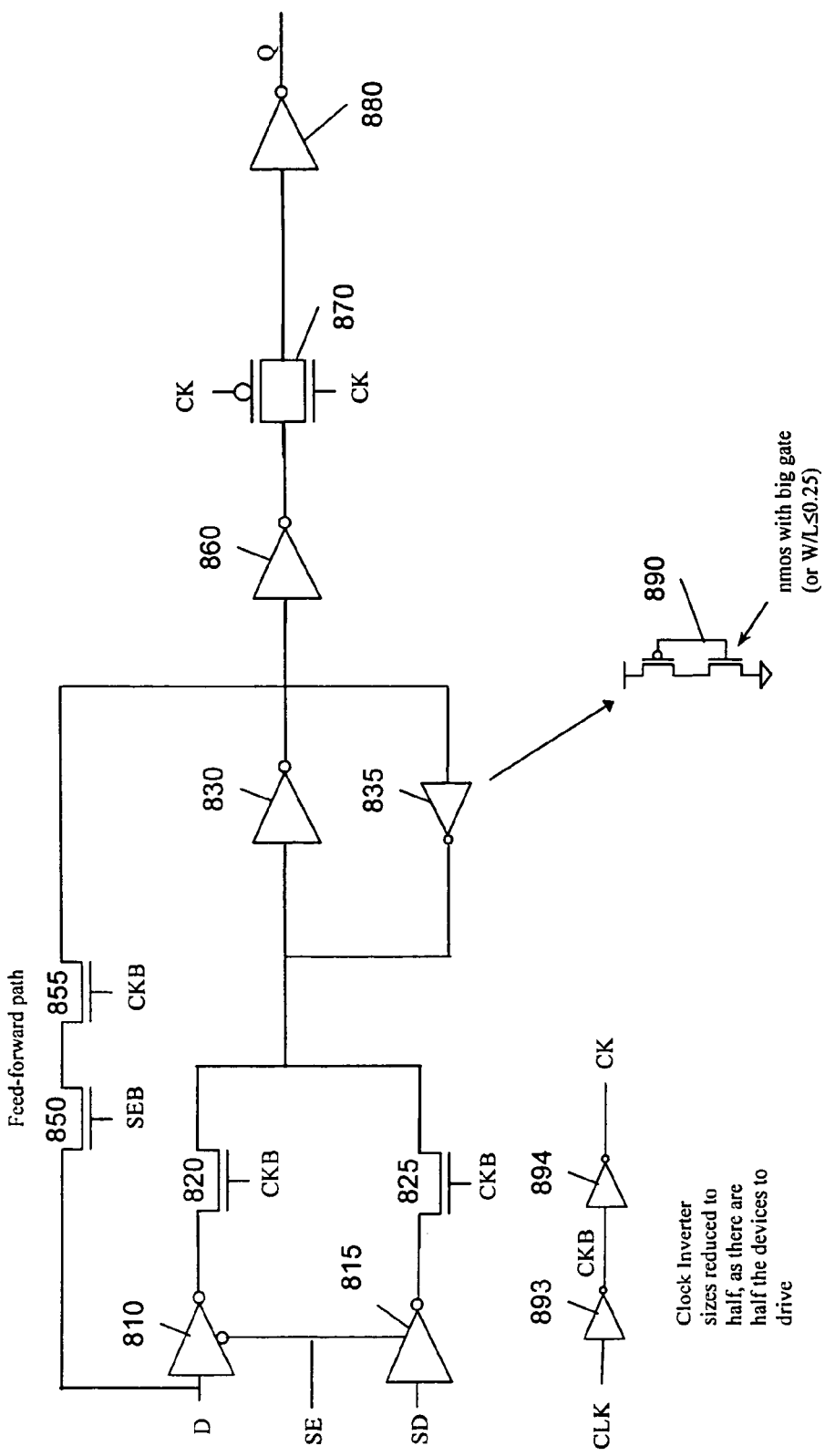
FIG. 8 illustrates a partially static flip-flop in accordance with at least one embodiment of the invention.

FIG. 8 shows an embodiment 800 of a partially static flip-flop in accordance with the invention. Elements 893, 894, 890, 810, 815, 820, 825, 830, 835, 840, 850, 855, 860, and 870 of FIG. 8 correspond to elements 693, 694, 690, 610, 615, 620, 625, 630, 635, 640, 650, 655, 660, and 670 of FIG. 6, respectively, and operate in a like manner thereto. Thus, these elements of FIG. 8 can be described in a like manner as discussed above with respect to FIG. 6. FIG. 8, however, includes only one inverter driver 880 at the Q output without any latch.

Modifications from circuit of FIG. 6 are as follows. The latch in the second stage of the flip-flop has been replaced by a single inverter making this stage static. In comparison to circuit 300 of FIG. 3, the transmission gate in the first stage latch has been removed and a single NMOS transistor has replaced the transmission gate in the data and scan data paths in the first stage.

The result again of replacing the transmission gate by a single NMOS transistor is an increased setup time. To overcome this problem, a feed-forward path is provided from data input (D) to the output of the first latch. This not only makes up for the increased setup time but also decreases it further to an even lower value when compared with a conventional scheme such as that of circuit 300.

By the removal of the transmission gate from the feedback path of the latch, two problems again arise. These include: (a) the inverter driving the latch needs an increased size to be able to cope with the increased strength needed to drive the latch; and (b) the time for this latch to "latch-up" or arrive at a stable state increases. These problems are overcome by carefully sizing the latch transistors in the following manner. In the latch, the gate size of the NMOS transistor is increased only in the feedback path. The size is determined after multiple simulations with different gate sizes. Then, after taking into account the speed versus power consumption, a tradeoff is made to arrive at an optimal gate size. The width/length (W/L) ratio for this NMOS transistor is $\leq 0.25 \pm 0.09$ depending on the technology/process used (i.e. 0.25 um, 0.18 um or 0.13 um).

The flip-flop design would need simulation for the determination of the most suitable sizes of each transistor that would result in the lowest power, maintaining or outperforming the setup, hold and clock-to-Q time requirements. Since the number of clocked transistors in this scheme has been reduced to exactly half when compared to the conventional scheme, the strength of clock inverters driving these flip-flops can also be reduced to almost half. Likewise, the resulting clock power would also be reduced almost in half. The sizes of the transistors in the rest of the flip-flop circuitry are also reduced, resulting in an overall area reduction.

The above scheme is well suited for applications where the fan-out ranges from 1 to 4. For applications needing a larger fan-out (>4), a modification of the scheme is used, where the feed-forward path from data input is fed-forward to the input of the first latch with an additional small inverter at the beginning of the feed-forward path to avoid any loading.

Figure 9:
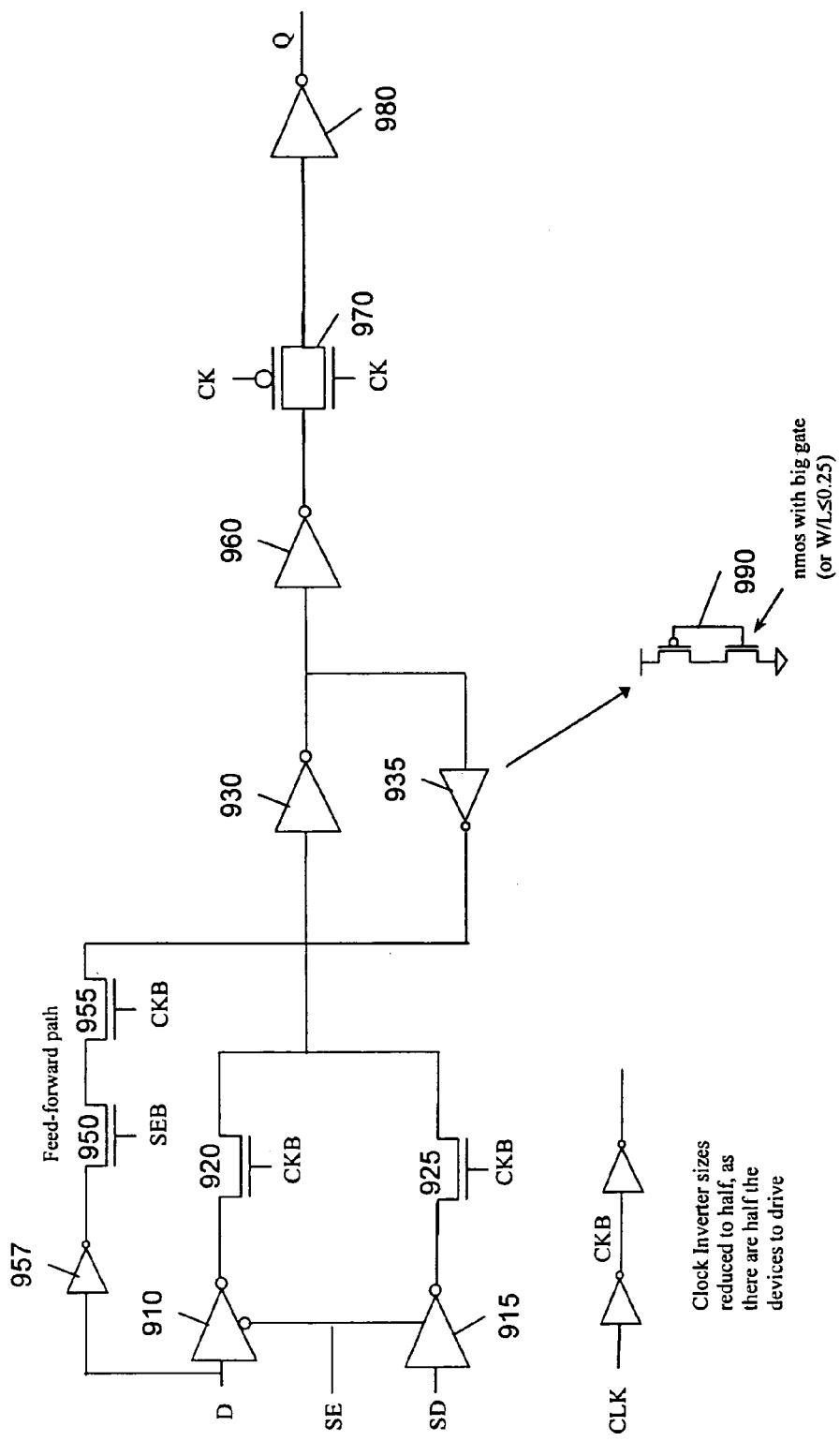
FIG. 9 illustrates a partially static flip-flop for larger fan-out applications in accordance with at least one embodiment of the invention.

This scheme is illustrated in circuit 900 of FIG. 9. Elements 993, 994, 990, 910, 915, 920, 925, 930, 935, 940, 950, 955, 960, and 970 of FIG. 9 correspond to elements 693, 694, 690, 610, 615, 620, 625, 630, 635, 640, 650, 655, 660, and 670 of FIG. 6, respectively, and operate in a like manner thereto. Thus, these elements of FIG. 9 can be described in a like manner as discussed above with respect to FIG. 6. FIG. 9, however, includes only one inverter driver 980 at the Q output without any latch and also includes a small inverter 957 which is coupled to the first of the transistors 950 in the feed forward path.

These circuits 800 and 900 can been implemented in 0.25 um, 0.18 um, and 0.13 um technologies. It can be shown or demonstrated that the following improvements in power, performance and area are available with circuits 800 and 900:

1. The power consumption improvement is a 45% to 55% power reduction in clock related circuitry;
2. Total power consumption is reduced by 7-22%;
3. An improvement of 10% to 21% overall area reduction in the flip-flop.
4. A performance/timing improvement such that all the flip-flops result in an equivalent or improved setup, hold, rise, fall and clock-to-Q times compared to flip-flops designed using conventional schemes.

Although the present invention has been described in detail with reference to the disclosed embodiments thereof, those skilled in the art will appreciate that various substitutions and modifications can be made to the examples described herein while remaining within the spirit and scope of the invention as defined in the appended claims.

What is claimed is:

1. An apparatus for holding and releasing a data signal and a scan data signal, comprising:
    a feed forward mechanism accepting said data signal;
    a selection and transmission mechanism for selecting and transmitting one of said data signal and scan data signal;
    a first latch configured to accept and hold said transmitted one of said data signal and said scan data signal;
    a first driver, the input of said first driver coupled to the first latch and to said feed forward mechanism;
    a transmission gate coupled to the output of said first driver;
    a second latch coupled to the output of said transmission gate; and
    an output diver coupled to the output of said second latch.

2. An apparatus according to claim 1 wherein said feed forward mechanism consists of two series connected transistors.

3. An apparatus according to claim 2 wherein said transistors are CMOS.

4. An apparatus according to claim 1 wherein said selection and transmission mechanism includes a first mechanism for said data signal and a second mechanism for said scan data signal.

5. An apparatus according to claim 4 wherein each said first and second mechanism consist of a inverter and series coupled transistor.

6. An apparatus according to claim 5 wherein a selection signal enables conduction either of the data signal through the inverter of the first mechanism or of the scan data signal through the inverter of the second mechanism.

7. An apparatus according to claim 1 wherein said first and second latches include a feedback path.

8. An apparatus according to claim 7 wherein said feedback path is configured as a large gate NMOS.

9. An apparatus according to claim 7 wherein said first and second latches include an inverter coupled to said feedback path.

10. An apparatus according to claim 1 wherein said first driver and said output driver are inverters.

11. An apparatus according to claim 2 wherein said feed forward mechanism further includes an inverter coupled to the first of the series connected transistors.

12. An apparatus for holding and releasing a data signal and a scan data signal, comprising:
- a feed forward mechanism accepting said data signal;
- a selection and transmission mechanism for selecting and transmitting one of said data signal and scan data signal;
- a first latch configured to accept and hold said transmitted one of said data signal and said scan data signal;
- a first driver, the input of said first driver coupled to the first latch and to said feed forward mechanism;
- a transmission gate coupled to the output of said first driver; and
- an output diver coupled to the output of said second latch.

13. An apparatus according to claim 12 wherein said feed forward mechanism consists of two series connected transistors.

14. An apparatus according to claim 13 wherein said transistors are CMOS.

15. An apparatus according to claim 12 wherein said selection and transmission mechanism includes a first mechanism for said data signal and a second mechanism for said scan data signal.

16. An apparatus according to claim 15 wherein each said first and second mechanism consist of a inverter and series coupled transistor.

17. An apparatus according to claim 16 wherein a selection signal enables conduction either of the data signal through the inverter of the first mechanism or of the scan data signal through the inverter of the second mechanism.

18. An apparatus according to claim 12 wherein said first and second latches include a feedback path.

19. An apparatus according to claim 18 wherein said feedback path is configured as a large gate NMOS.

20. An apparatus according to claim 18 wherein said first and second latches include an inverter coupled to said feedback path.

21. An apparatus according to claim 12 wherein said first driver and said output driver are inverters.

22. An apparatus according to claim 13 wherein said feed forward mechanism further includes an inverter coupled to the first of the series connected transistors.

* * * * *